United States Patent
Naiki et al.

[11] Patent Number: 6,021,145
[45] Date of Patent: Feb. 1, 2000

[54] LASER DIODE ARRAY UNIT

[75] Inventors: Toshio Naiki; Akiyoshi Hamada, both of Toyokawa, Japan

[73] Assignee: Minolta Co., Ltd., Osaka, Japan

[21] Appl. No.: 08/932,084

[22] Filed: Sep. 17, 1997

[30] Foreign Application Priority Data

Sep. 24, 1996 [JP] Japan .................................... 8-251746

[51] Int. Cl.[7] ................................ H01S 3/18; H01S 3/00
[52] U.S. Cl. .................................. 372/43; 372/33
[58] Field of Search .................... 372/50, 33, 43; 347/135; 369/44.32; 250/234; 359/205

[56] References Cited

U.S. PATENT DOCUMENTS

| | | | |
|---|---|---|---|
| 5,432,537 | 7/1995 | Imakawa et al. | 347/135 |
| 5,490,160 | 2/1996 | Kovacs et al. | 372/50 |

FOREIGN PATENT DOCUMENTS

| | | |
|---|---|---|
| 6-164056 | 6/1994 | Japan . |
| 6-164070 | 6/1994 | Japan . |
| 7-193336 | 7/1995 | Japan . |

*Primary Examiner*—Rodney Bovernick
*Assistant Examiner*—Quyen Phan Leung
*Attorney, Agent, or Firm*—Sidley & Austin

[57] ABSTRACT

A laser diode array unit for use in laser beam scanning optical apparatus and the like. The laser diode array has plural light emitting sources to be drivingly controlled independently of each other. The laser diode array is so disposed as to permit laser beams emitted from the light emitting sources to be incident to a collimator lens. On an optical axis between the laser diode array and the collimator lens is disposed a beam splitter for splitting the laser beams emitted from the light emitting sources into image light and monitor light. A magnifier lens and a photoreceptor element are arranged on the optical axis so as to allow incidence of monitor light oriented to advance in a direction perpendicular to the direction of advance of image light.

20 Claims, 10 Drawing Sheets

F I G. 1 4
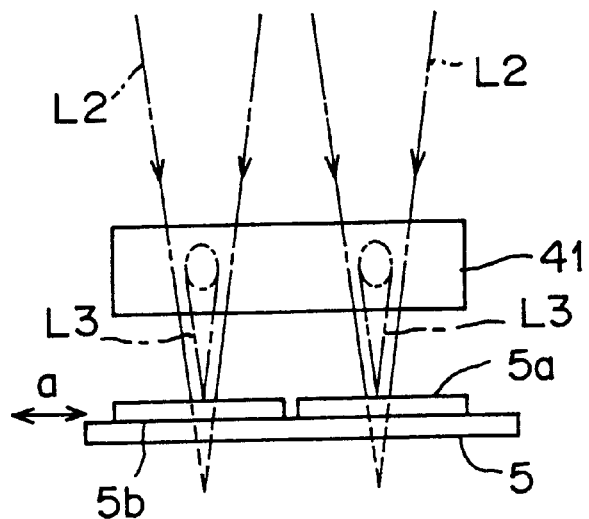
F I G. 1 5
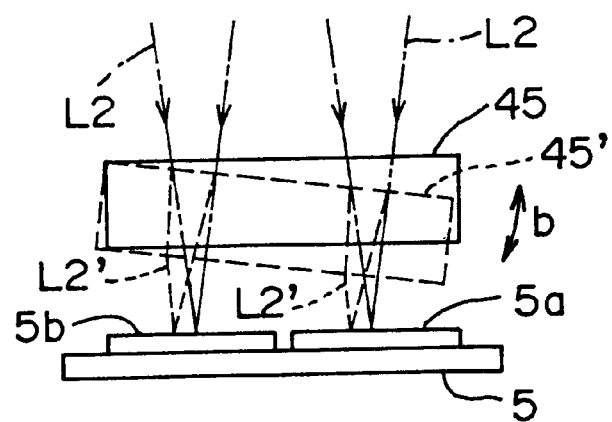

LASER DIODE ARRAY UNIT

BACKGROUND OF THE INVENTION

1. Field of the Invention

The present invention relates to a laser diode array unit, and more particularly, to a laser diode array unit for use in laser beam scanning optical devices and the like.

2. Description of Related Arts

Recently, for use as a light source device in a laser beam scanning optics arrangement, laser diode arrays having a plurality of light emitting points have been receiving attention. For use with such laser diode array, monitoring mechanisms for monitoring the emission intensity of light emitting from the laser diode array itself have been proposed including one such that a half mirror is used to direct monitoring light onto a photoreceptor element as described in Japanese Patent Application Laid-Open No. 6-164056, and another such that an aperture having a polished surface is used to conduct monitoring light onto a photoreceptor element as described in Japanese Patent Application Laid-Open No. 6-164070.

The above cited arrangements are such that the mechanism for monitoring the intensity of light is provided outside the laser diode array package. Whilst, there has also been proposed an arrangement such that the intensity monitoring mechanism is provided within the laser diode array package. In such an intensity monitoring mechanism, laser beams emitted from individual light emitting sources are separated by means of a barrier so as to be prevented from overlapping, and the separated laser beams are separately monitored by photoreceptor elements corresponding to respective laser beams which are provided within the laser diode array.

However, of these prior art intensity monitoring mechanisms, those of the type in which the monitoring mechanism is provided outside the laser diode array package are such that the light emitting sources in the laser diode array are spaced a small distance from each other, say, on the order of several tens of $\mu$m, so that laser beams emitted from respective light emitting sources overlap one with another, which fact makes it difficult to separately monitor the intensity of light with respect to laser beams emitted from respective light emitting sources. Therefore, such monitoring mechanism could only monitor a total intensity of light of plural laser beams.

Those of the type in which the intensity monitoring mechanism is provided within the laser diode array package involve a problem that the laser diode array itself is complex in construction and higher in cost. Another problem is that since the construction of the laser diode array requires provision of a barrier or the like, it is impracticable to reduce the distance between the light emitting sources.

SUMMARY OF THE INVENTION

The object of the present invention is to provide a laser diode array unit which can monitor the intensity of light separately with respect to laser beams emitted from individual light emitting sources.

In order to accomplish the above object, the laser diode array unit in accordance with the present invention comprises a laser diode array having a plurality of light emitting sources which are drivingly controlled independently of each other; a beam split element for splitting monitor beams from respective laser beams emitted from the light emitting sources of the laser diode array; a photoreceptor element for independently monitoring respective intensity of light of the monitor beams; and a magnifier optic system for enabling the monitor beam to be condensed on the photoreceptor element to form a magnified image.

According to the foregoing arrangement, part of laser beams emitted from the respective light emitting sources is made to serve as monitor beam by the beam split element. Since the monitor beam is condensed on the photoreceptor element by the magnifier optic system to form a magnified image, there can be provided a larger distance between monitor beam images projected onto the photoreceptor element. Therefore, the intensity of light from the respective light emitting sources can be separately monitored without involving any overlapping of monitor beam rays and in a stable manner.

In the laser diode array unit of the present invention, the plurality of light emitting sources are synchronously driven, and the photoreceptor element has a split light receiving surface and outputs electric currents according to the intensity of light of laser beams incident to respective light receiving areas of the split light receiving surface. This arrangement permits the relative position of monitor beam and the photoreceptor element to be corrected to an optimum condition at all times, irrespective of any changes in the ambient conditions (temperature) of the laser diode array unit.

In a further aspect of the present invention, the laser diode array unit includes a relay lens provided between the laser diode array and the magnifier optic system such that an intermediate image of the monitor beam is formed between the relay lens and the magnifier optic system. This arrangement makes it possible to increase the lateral magnification of the monitoring optics without the necessity of increasing the image side conjugate length of the magnifier optic system, thereby reducing the distance between the magnifier optic system and the photoreceptor element.

Further, in the laser diode array unlit of the invention, the magnifier optic system is a retrofocus—type lens system comprising a first set of lenses having a negative power and a second set of lenses having a positive power which are arranged in a sequential order from the photoreceptor element side. According to this arrangement, the position of the fore-side principal point of the magnifier optic system on the laser diode array side shifts further from the magnifier optic system toward the laser diode array. Therefore, the lateral magnification of the magnifier optic system can be increased without increasing the total length of the magnifier optic system. In the foregoing arrangement, assuming that the light receiving surface of the photoreceptor element is an object surface and that the light emitting sources of the laser diode array is an image point, the lens arrangement is substantially equivalent to that of photographic wide-angle lenses.

BRIEF DESCRIPTION OF THE DRAWINGS

FIG. 14 is a front view for explaining the correction of the monitoring position of the photoreceptor element shown in FIG. 12;

FIG. 15 is a front view showing another example of monitoring position correction with respect to the seventh embodiment;

DETAILED DESCRIPTION OF THE PREFERRED EMBODIMENTS

Figure 1:
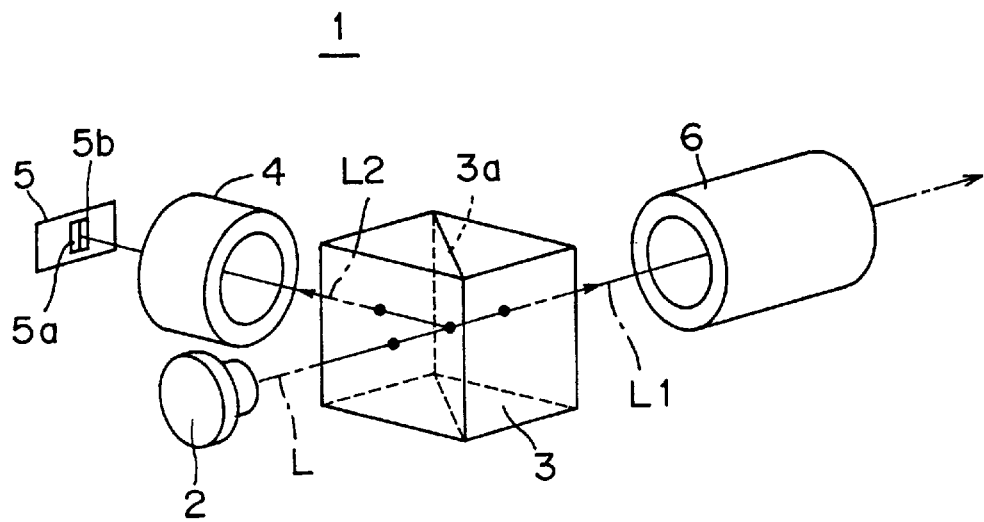
FIG. 1 is a perspective view showing a first embodiment of the laser diode array unit in accordance with the present invention.

Embodiments of the laser diode array unit in accordance with the present invention will now be described with reference to the accompanying drawings. In the embodiments, like parts and like portions are designated by like reference numerals.

Figure 2:
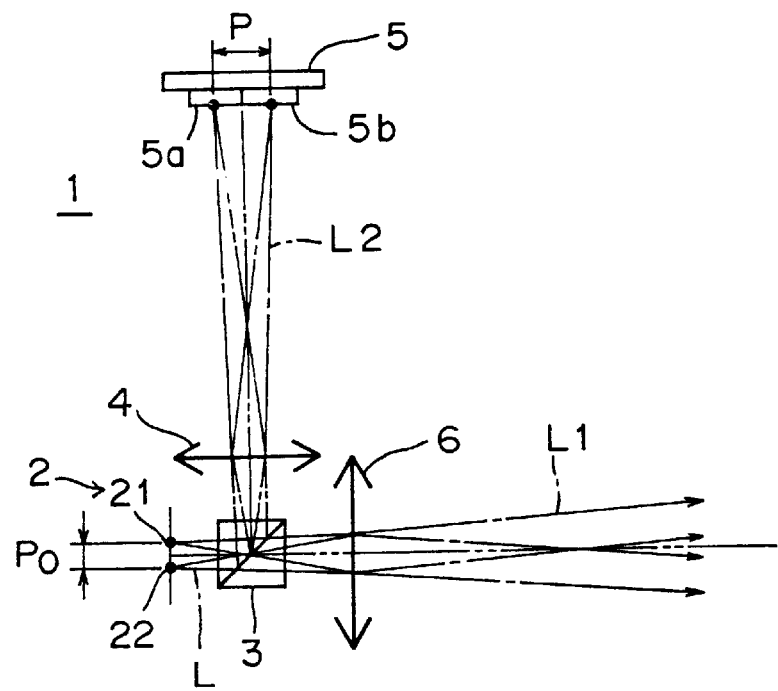
FIG. 2 is a layout view of the laser diode array unit shown in FIG. 1.
Figure 3:
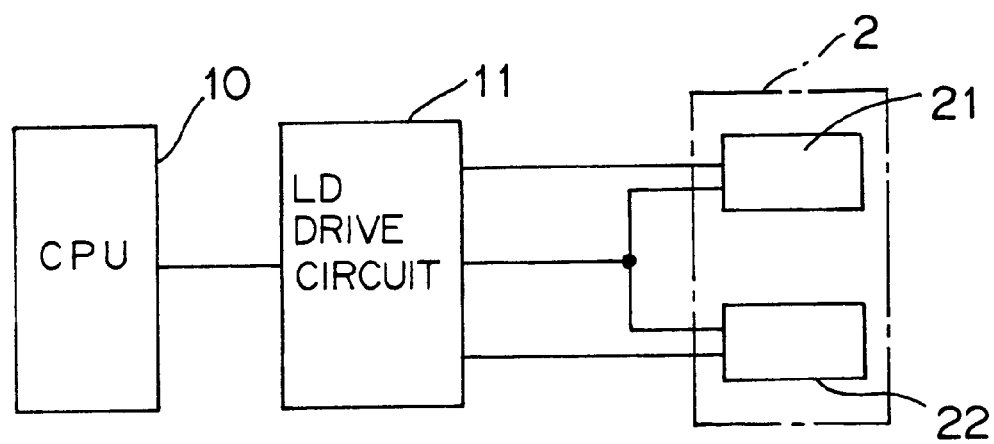
FIG. 3 is a block diagram of a drive circuit in the laser diode array.

Embodiment 1 (FIGS. 1 through 3)

As FIGS. 1 and 2 show, a laser diode array unit 1 consists essentially of a laser diode array 2, a beam splitter 3, a magnifier lens 4, a photoreceptor element 5, and a collimator lens 6.

The laser diode array 2 includes a plurality of light emitting sources (two in number in the present embodiment, but of course the number may be three or more; the same applies in the embodiments to follow) 21, 22 adapted to be drivingly controlled independently of each other. The laser diode array 2 is so disposed as to enable laser beams L radiated from the light emitting sources 21, 22 to become incident to the collimator lens 6. Disposed on an optical axis between the laser diode array 2 and the collimator lens 6 is a beam splitter 3 for splitting the laser beams L emitted from the light emitting sources 21, 22 into image light Li and monitor light L2. The magnifier lens 4 and the photoreceptor element 5 are so arranged on the optical axis as to allow the incidence of monitor light L2 and to advance in a direction perpendicular to the direction of advance of image light L1. The photoreceptor element 5 has two light receiving faces 5a, 5b.

As FIG. 3 shows, image data output from CPU 10 is input to an LD drive circuit 11. The light emitting sources 21, 22 of the laser diode array 2 are modulatedly (on-off) controlled independently of each other on the basis of image data input to the LD drive circuit 11 and radiate laser beams when they are on. For this purpose, the light emitting sources 21, 22 are synchronously driven.

The laser beams L emitted respectively from the light emitting sources 21, 22 of the laser diode array 2 are partly reflected from a joint plane 3a of the beam splitter 3. The reflected beams, as monitor light L2, are focused through the magnifier lens 4 onto the light receiving faces 5a, 5b of the photoreceptor element 5. Specifically, the laser beam L emitted from the light emitting source 21 is projected onto the light receiving face 5a, and the laser beam L emitted from the light emitting source 22 is projected onto the light receiving face 5b. The monitoring optics system from the laser diode array 2 to the photoreceptor element 5 constitutes a magnifier system, and the laser beams L emitted respectively from the light emitting sources 21, 22, spaced a distance $P_0$ from each other, are focused onto the photoreceptor element 5 at positions spaced a distance P expressed by the following relation (1):

$$P = \beta P_0 \quad (1)$$

where $\beta$ represents a lateral magnification of the monitoring optics system, which is preferably set to 70× or higher magnification. If $\beta$ is set to 70×, the above relation (1) tells that the distance P between images formed on the photoreceptor element 5 can be of the order of 1 mm, whereas the distance between the light emitting sources 21 and 22 is usually of the order of several tens of $\mu$m. Thus, overlapping of monitor light L2 is prevented, and this permits the intensity of light from light emitting sources 21, 22 to be separately monitored in a stable manner.

Whilst, remaining portions, as image light L1, of the laser beams which have been transmitted through the beam splitter 3 are converged by the collimator lens 6 in generally parallel relation, and are focused at minute points through a deflector and/or an optical element, not shown, so that they are linearly scanned over a scanning surface at a generally uniform rate.

Thus, with such a simple arrangement that a magnifier lens 4 is provided between the beam splitter 3 and the photoreceptor element 5, the distance between laser beams emitted from small-spaced light emitting sources 21, 22 can be increased on the photoreceptor element 5. This makes it possible to obtain a laser diode array unit 1 which can always separately monitor the intensity of light from the light emitting sources 21, 22.

Figure 4:
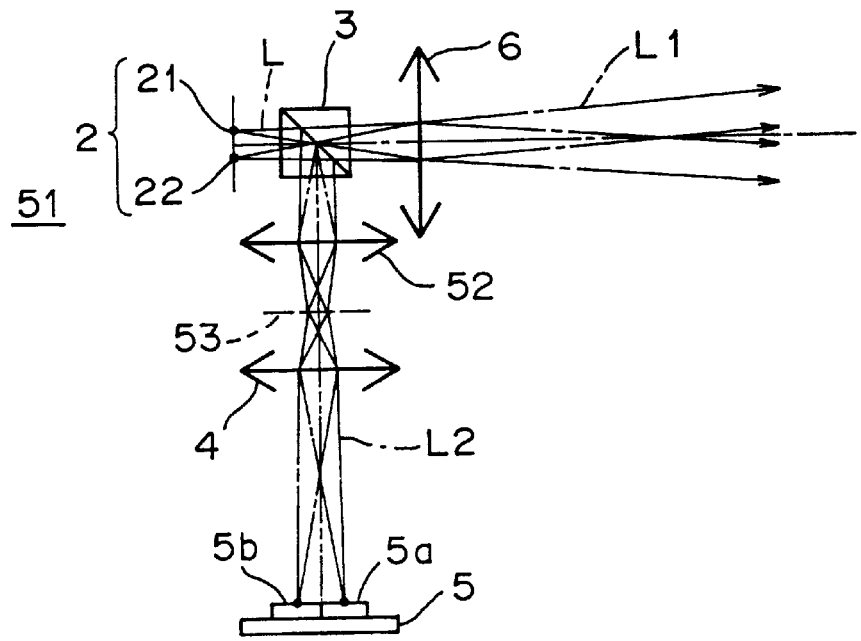
FIG. 4 is a layout diagram showing a second embodiment of the laser diode array unit in accordance with the present invention.

Embodiment 2 (FIG. 4)

With the above described laser diode array unit 1 of Embodiment 1, the lateral magnification $\beta$ of the monitoring optic system can be made larger as the position of principal point of the magnifier lens 4 is set more upstream in the optical axis, that is, set closer to the laser diode array 2 along the optical path. However, the possibility of reducing the distance between the magnifier lens 4 and the laser diode array 2 is limited because of the fact that the beam splitter 3 is disposed between the laser diode array 2 and the magnifier lens 4, coupled with some limitations arising from the sizes of such functional elements as laser diode array 2 and magnifier lens 4, and of associated holding members. Therefore, in case that a laser diode array unit 1 with a larger lateral magnification β is required, the trouble is that the length of the optical path from the laser diode array 2 to the photoreceptor element 5 must be increased.

Therefore, the present Embodiment 2 presents a laser diode array unit which provides a higher lateral magnification β even where the length of optical path from the laser diode array to the photoreceptor element is relatively short.

As FIG. 4 shows, a laser diode array unit 51 consists essentially of a laser diode array 2, a beam splitter 3, a magnifier lens 4, a photoreceptor element 5, a collimator lens 6, and a relay lens 52.

The relay lens 52 is disposed between the beam splitter 3 and the magnifier lens 4. The relay lens 52 transmits an illuminant image of monitor light L2 spectro-reflected by the beam splitter 3, in a magnified size or in its original size. That is, the illuminant image of monitor light L2 is formed as an intermediate image by the relay lens 52 at a position shown by dotted line 53 in FIG. 4. The intermediate image is magnified by the magnifier lens 4 at high magnifications, and the so magnified image is projected onto the light receiving faces 5a, 5b. In this case, the lateral magnification β of the monitoring optic system can be increased without increasing the image-side conjugate length of the magnifier lens 4, and the distance between the magnifier lens 4 and the photoreceptor element 5 can be decreased. Also, by selecting any desired magnifier lens 4, it is possible to freely set the lateral magnification β and the conjugate distance between the intermediate image and the photoreceptor element 5. In this way, the laser diode array unit 51 can obtain a high lateral magnification β even when the optical path length from the laser diode array 2 to the photoreceptor element 5 is rather short.

Figure 5:
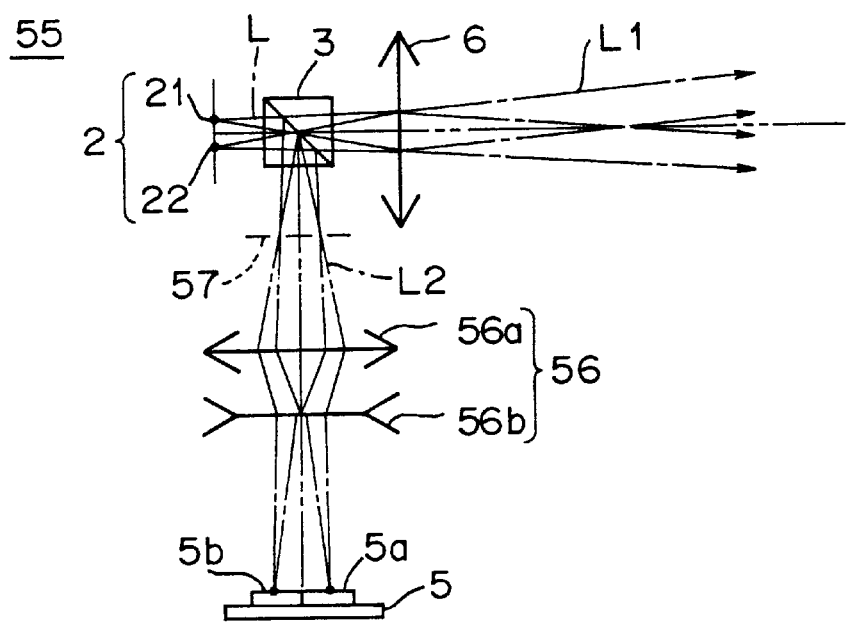
FIG. 5 is a layout diagram showing a third embodiment of the laser diode array unit in accordance with the invention.

Embodiment 3 (FIG. 5)

Embodiment 3 presents another type of laser diode array unit in which the optical path length from the laser diode array to the photoreceptor element is rather short but which has a high lateral magnification β.

As FIG. 5 shows, a laser diode array unit 55 consists essentially of a laser diode array 2, a beam splitter 3, a photoreceptor element 5, a collimator lens 6, and a magnifier lens system 56.

The magnifier lens system 56 is a retrofocus type lens system comprising a lens 56b having a negative power and a lens 56a having a positive power which are arranged on the optical axis in sequential order from the photoreceptor element 5 side.

According to the above arrangement, the position of the foreside principal point of the magnifier lens system 56 shifts from the magnifier lens system 56 toward the laser diode array 2, and therefore, the lateral magnification of the magnifier lens system 56 can be increased without increasing the total length of the magnifier lens system 56. In the foregoing arrangement, assuming that the light receiving surfaces of the photoreceptor element 5 are object surfaces and that the illuminant position of the laser diode array 2 is an image point, the lens arrangement is substantially equivalent to that of photographic wide-angle lenses.

Thus, the laser diode array unit 55 can obtain a high lateral magnification β even when the optical path length from the laser diode array 2 to the photoreceptor element 5 is rather short. In FIG. 5, the position shown by a dotted line 57 is a pupil position at which a diaphragm may be provided for aberration adjustment.

Embodiments 4, 5 and 6 (FIGS. 6 through 9)

Embodiments 4 through 6 present laser diode array units for separating a laser beam transmitted through the collimator lens into image light and monitor light.

Figure 6:
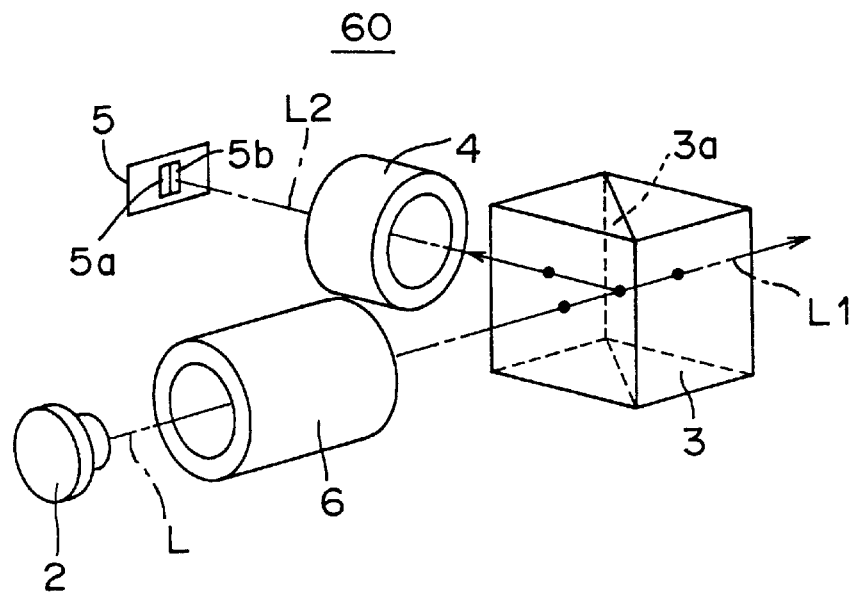
FIG. 6 is a perspective view showing a fourth embodiment of the laser diode array unit in accordance with the invention.
Figure 7:
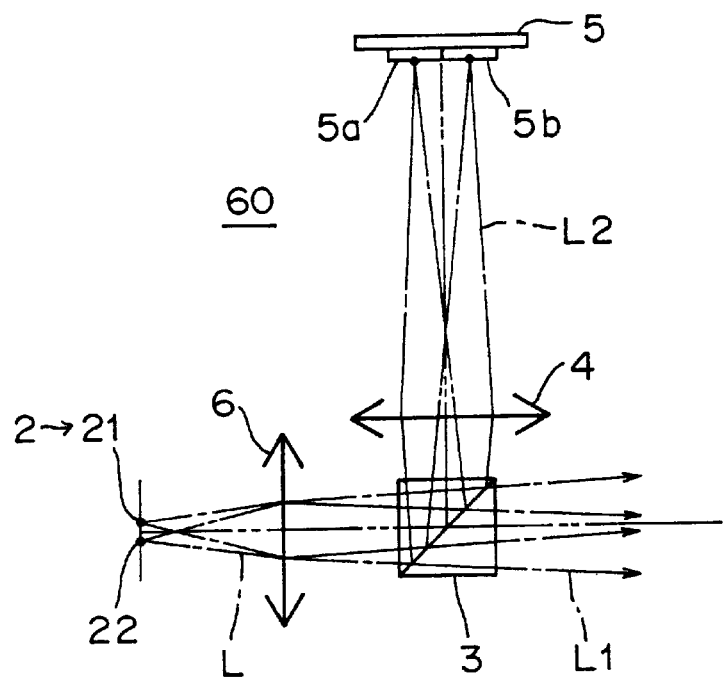
FIG. 7 is a layout diagram of the laser diode array unit shown in FIG. 6.

As FIGS. 6 and 7 show, a laser diode array unit 60 of Embodiment 4 consists essentially of a laser diode array 2, a beam splitter 3, a magnifier lens 4, a photoreceptor element 5, and a collimator lens 6. The beam splitter 3 is disposed behind the collimator lens 6.

Laser beams L emitted from the light emitting sources 21, 22 are converged generally parallel by the collimator lens 6, and thereafter, the converged beams are partly reflected from a joint plane 3a of the beam splitter 3. The reflected beams, as monitor light L2, are focused onto the light receiving faces 5a, 5b through the magnifier lens 4. That is, the monitor optic system from the laser diode array 2 to the photoreceptor element 5 functions as a magnifier system, and the lateral magnification β is determined by a focal length ratio of the magnifier lens 4 to the collimator lens 6. In this way, the distance between images of the laser beams emitted from small-spaced light emitting sources 21, 22 can be increased on the photoreceptor element 5. Thus, the laser diode array unit 60 can prevent overlapping of monitor light L2 and constantly permits the intensity of light from the light emitting sources 21, 22 to be separately monitored.

However, this arrangement poses one problem such that in order to increase the lateral magnification β of the monitoring optic system of the laser diode array unit 60, the image side conjugate length of the magnifier lens 4 must be increased, which results in an increase in the length of light path from the laser diode array 2 to the photoreceptor element 5.

Figure 8:
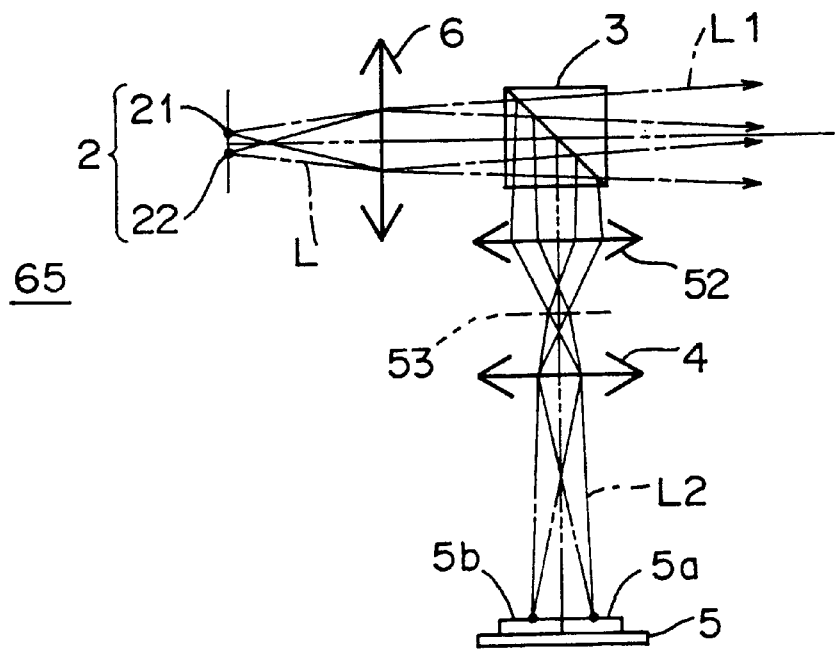
FIG. 8 is a layout diagram showing a fifth embodiment of the laser diode array unit in accordance with the invention.

In order to overcome the foregoing problem, in Embodiment 5 of the invention, as FIG. 8 shows, a relay lens 52 is provided between the beam splitter 3 and the magnifier lens 4. According to this arrangement, it is possible to increase the lateral magnification β of the monitor optic system to a high power level without increasing the image side conjugate length of the magnifier lens 4. Thus, a laser diode array unit 65 having a high lateral magnification β can be obtained even when the length of the light path from the laser diode array 2 to the photoreceptor element 5 is rather short. For this laser diode array unit 65, the collimator lens 6, the relay lens 52 and the magnifier lens 4 may be independently designed as such. This affords considerable freedom of design.

Figure 9:
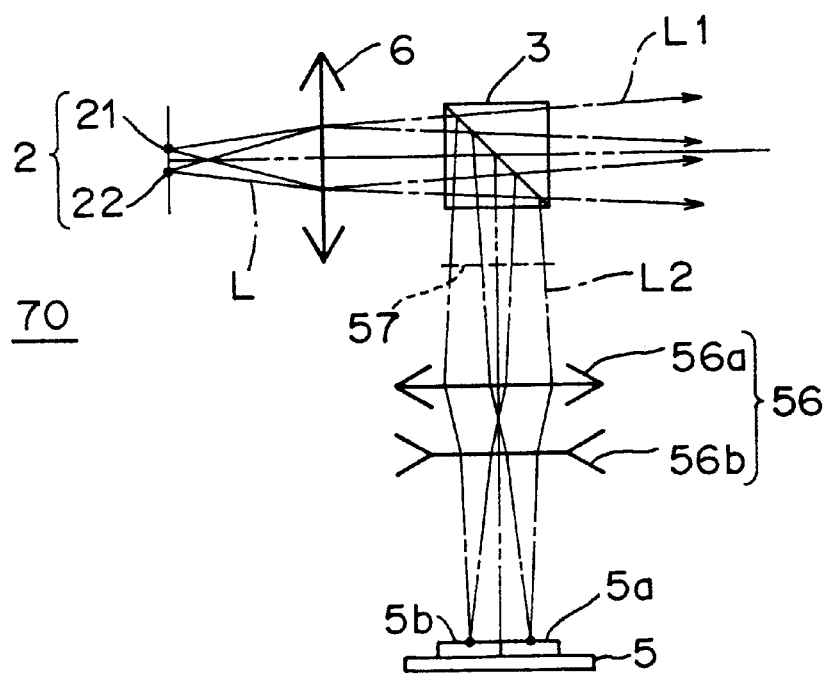
FIG. 9 is a layout diagram showing a sixth embodiment of the laser diode array unit in accordance with the invention.

The Embodiment 6 presents a laser diode array unit 70 incorporating a retrofocus type lens system which, as FIG. 9 shows, comprises a lens 56b having a negative power and a lens 56a having a positive power which are arranged on the optical axis sequentially from the photoreceptor element 5 side. According to this arrangement, the laser diode array unit 70 can have a high level of lateral magnification β even when the optical path length from the laser diode array 2 to the photoreceptor element 5 is rather short.

In the Embodiments 3 through 6, though the beam emitted from the collimator lens 6 is a parallel beam, it is possible that the beam emitted from the collimator lens 6 is convergent in shape.

Embodiment 7 (FIGS. 10 through 15)

In laser diode array units of the foregoing Embodiments 1 through 6, there may occur some deviations in relative positions of the laser diode array 2, the beam splitter 3, the magnifier lens 4, and/or collimator lens 6 due to some mechanical error and/or changes of ambient condition (temperature). For example, if the position of the laser diode array 2 shifts several tens of μm in the direction of the side-by-side arrangement of the light emitting sources 21, 22, spots Lb of monitor light L2 projected onto the light receiving faces 5a, 5b would be displaced by the following formula, $$\beta \cdot \Delta L$$

wherein β represents a lateral magnification of monitor optic system and ΔL represents an amount of shift of laser diode array 2. However, in order to increase the distance between monitor light beams on the photoreceptor element 5, lateral magnification β is increased to a high power level, and this tends to produce high error sensitivity. Possibly, therefore, the spots Lb of monitor light L2 may straddle the light receiving faces 5a and 5b, or the spots of two monitor light beams may be projected onto the light receiving face 5a; and this may lead to erroneous detection of the intensity of light.

As a countermeasure against the foregoing problem, Embodiment 7 provides for correction of monitoring position.

Example 1 of Monitor Position Adjustment

Figure 10:
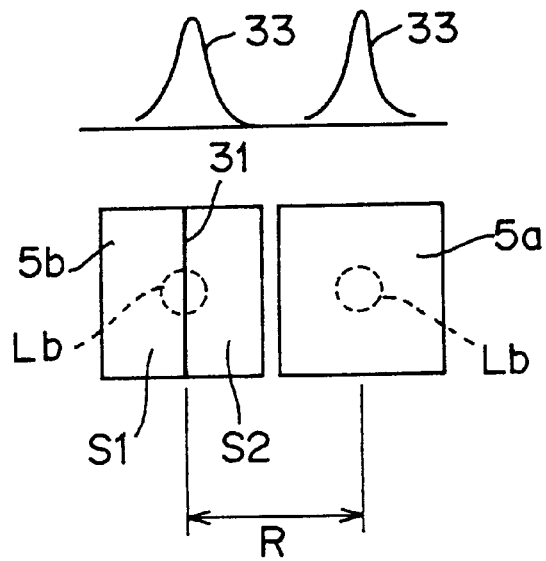
FIG. 10 is a plan view for explaining a photoreceptor element of a seventh embodiment of the laser diode array unit in accordance with the invention.

As FIG. 10 shows, the light receiving face 5b of the photoreceptor element 5 is a light receiving surface split by a split line 31 into two parts. Each of the respective light receiving areas S1, S2 of the split light receiving surface outputs an electric current proportional to the intensity of light received. The light receiving face 5a is a single photoreceptor surface and outputs an electric current proportional to the intensity of incident light.

Distance R between the center line of the light receiving face 5a and the split line 31 of the light receiving face 5b is set to be substantially equal to the value of the following formula, $$Po \cdot \beta$$

wherein where β represents a lateral magnification of monitor optic system and Po represents a distance between light emitting sources 21 and 22. On a pedestal supporting the photoreceptor element 5 there is provided a parallel shifting mechanism, not shown including a rack-and-pinion held in mesh engagement with a gear which can be driven by a micro-stepping motor or the like.

When spots Lb of monitor light L2, having a beam intensity profile as expressed by a curve 33 shown in FIG. 10, are projected onto the light receiving faces 5a, 5b, light receiving areas S1, S2 of the two-part light receiving face 5b output electric currents in proportion to the intensity of light received. If the difference between the output of the light receiving area S1 and the output of the light receiving area S2 is less than a predetermined value, it is determined that the photoreceptor element 5 is at its regular monitoring position, and accordingly the intensity of light from one of the light emitting sources is monitored by the output of the light receiving face 5a. The intensity of light from the other light emitting source is monitored by a combined total of the outputs of the light receiving areas S1 and S2.

Figure 11:
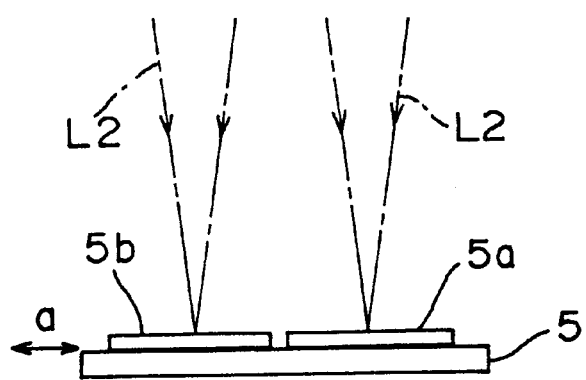
FIG. 11 is a front view for explaining the correction of a monitoring position of the photoreceptor element shown in FIG. 10.

On the other hand, if the difference between the output of the light receiving area S1 and the output of the light receiving area S2 is more than the predetermined value, it is determined that the photoreceptor element 5 is off its regular monitoring position, and while sampling is made with respect to the output difference, the monitoring position of the photoreceptor element 5 is corrected in such a way that the pedestal supporting the photoreceptor element 5 is moved by a micro-stepping motor or the like through the parallel shifting mechanism in the direction of arrow a as shown in FIG. 11, that is, in a direction perpendicular to the split line 31 of the light receiving face 5b. When the output difference drops below the predetermined value, the micro-stepping motor is turned off, and a day run torque of the micro-stepping motor is utilized to hold the pedestal in position. In this condition, the intensity of light of one light emitting source is monitored by the output of the light receiving face 5a, and the intensity of light of the other light emitting source is monitored by a combined output of the light receiving areas S1 and S2. In this way, the photoreceptor element 5 can constantly receive monitor light L2 at its regular monitoring position without any detection error being caused, monitoring accuracy being thus enhanced.

Example 2 of Monitoring Position Adjustment

Figure 12:
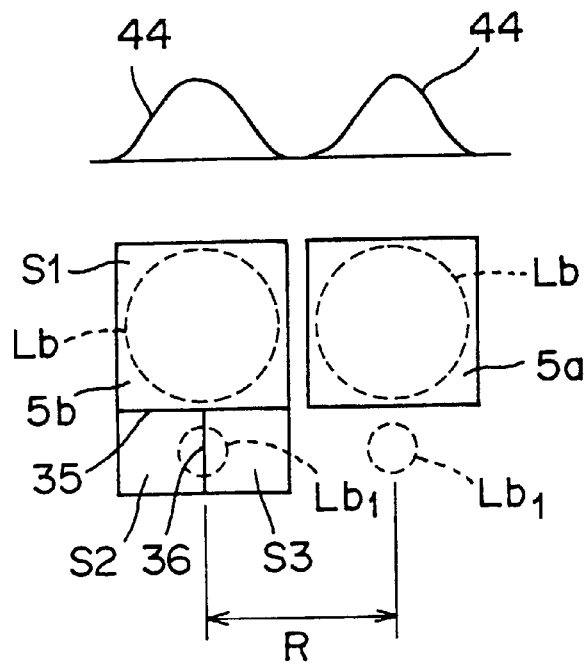
FIG. 12 is a plan view for explaining another photoreceptor element of the seventh embodiment of the laser diode array unit in accordance with the invention.

As FIG. 12 shows, the light receiving face 5b of the photoreceptor element 5 is a light receiving surface split by two split lines 35, 36 into three parts. Each of respective light receiving areas S1, S2, S3 of the split light receiving surface outputs an electric current proportional to the intensity of light received. The light receiving face 5a is a single photoreceptor surface. Distance R between the center line of the light receiving face 5a and the split line 36 of the light receiving face 5b is set to be substantially equal to the value of the following formula, $$Po \cdot \beta$$

wherein where β represents a lateral magnification of monitor optic system and Po represents a distance between light emitting sources 21, and 22. On a pedestal supporting the photoreceptor element 5 there is provided, not shown though, a parallel shifting mechanism, not shown including a rack-and-pinion held in mesh engagement with a gear which can be driven by a micro-stepping motor or the like.

Figure 13:
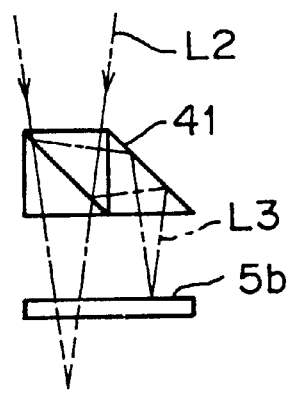
FIG. 13 is a side view for explaining the correction of a monitoring position of the photoreceptor element shown in FIG. 12.

Further, as FIGS. 13 and 14 show, an optical path split element 41 (prism in Embodiment 7) is disposed before the photoreceptor element 5. Part of monitor light L2 is split off by the optical path split element 41 for use as position sensing light L3. Spots Lb of monitor light L2, having a beam intensity profile shown by a curve 44 (see FIG. 12), are projected onto the light receiving faces 5a, 5b, and further a spot Lb1 of position sensing light L3 is projected onto the light receiving face 5b. The spots Lb of monitor light L2 are spread wider on the light receiving faces 5a, 5b by an optical path difference than the spots LB1 of position sensing light L3. This results in a decrease in error sensitivity due to an error of monitoring position of the photoreceptor element 5.

In the light receiving face 5b, the spot Lb of monitor light L2 is projected onto the light receiving area S1, and the spot Lb1 of position sensing light L3 is projected onto the light receiving areas S2, S3. If the difference between the output of the light receiving area S2 and the output of the light receiving area S3 is less than a predetermined value, it is determined that the photoreceptor element 5 is at its regular monitoring position, and accordingly the intensity of light of one of the light emitting sources is monitored by the output of the light receiving face 5a, and the intensity of light of the other light emitting source is monitored. On the other hand, if the difference between the output of the light receiving area S2 and the light receiving area S3 is more than the predetermined value, it is determined that the photoreceptor element 5 is off its regular monitoring position, and accordingly the pedestal supporting the photoreceptor element 5 is moved by a micro-stepping motor through the parallel shifting mechanism in the direction of arrow a as shown in FIG. 14 for correcting the monitoring position of the photoreceptor element 5. When the output difference drops below the predetermined value, the micro-stepping motor is turned off, and a day run torque of the micro-stepping motor is utilized to hold the pedestal in position. In this condition, the intensity of light of one light emitting source is monitored by the output of the light receiving face 5a, and the intensity of light of the other light emitting source is monitored by the output of the light receiving area S1. In this way, the photoreceptor element 5 can constantly receive monitor light L2 at its regular monitoring position without any detection error being caused, monitoring accuracy being thus enhanced.

Example 3 of Monitoring Position Adjustment

As FIG. 15 shows, a transparent flat plate 45 (flat glass plate in Embodiment 7) is disposed before the photoreceptor element 5. On a pedestal supporting the transparent flat plate 45 there is provided, not shown though, a pivoting mechanism including a rack-and-pinion held in mesh engagement with a gear which can be driven by a microstepping motor or the like. The photoreceptor element 5 is similar to the one described in Example 1 of monitor position adjustment.

When spots Lb of monitor light L2 are projected onto the light receiving faces 5a, 5b, currents proportional to the intensity of light received are output from the light receiving areas S1, S2 of the two-part light receiving face 5b. If the difference between the output of the light receiving area S1 and the output of the light receiving area S2 is less than a predetermined value, it is determined that the photoreceptor element 5 is at its regular monitoring position, and accordingly the intensity of light from one of the light emitting sources is monitored by the output of the light receiving face 5a. The intensity of light from the other light emitting source is monitored by a combined output of the light receiving areas S1 and S2.

On the other hand, if the difference between the output of the light receiving area S1 and the output of the light receiving area S2 is more than the predetermined value, it is determined that the photoreceptor element 5 is off its regular monitoring position, and while sampling is made with respect to the output difference, the monitoring position of the photoreceptor element 5 is corrected in such a way that the pedestal supporting the transparent flat plate 45 is moved by a micro-stepping motor through the pivoting mechanism in the direction of arrow b as shown in FIG. 15, for example to a position indicated by dotted line 45', whereby projection positions of the spots Lb of monitor light L2 on the light receiving faces 5a, 5b are moved to the position indicated by dotted line L2' for correction. When the output difference drops below the predetermined value, the micro-stepping motor is turned off, and a day run torque of the micro-stepping motor is utilized to hold the pedestal in position. In this condition, the intensity of light of the one light emitting source is monitored by the output of the light receiving face 5a, and the intensity of light of other light emitting source is monitored by a combined output of the light receiving areas S1 and S2.

In this way, the photoreceptor element 5 can constantly receive monitor light L2 at its regular monitoring position without any detection error being caused, monitoring accuracy being thus enhanced.

Other Embodiments

Figure 16:
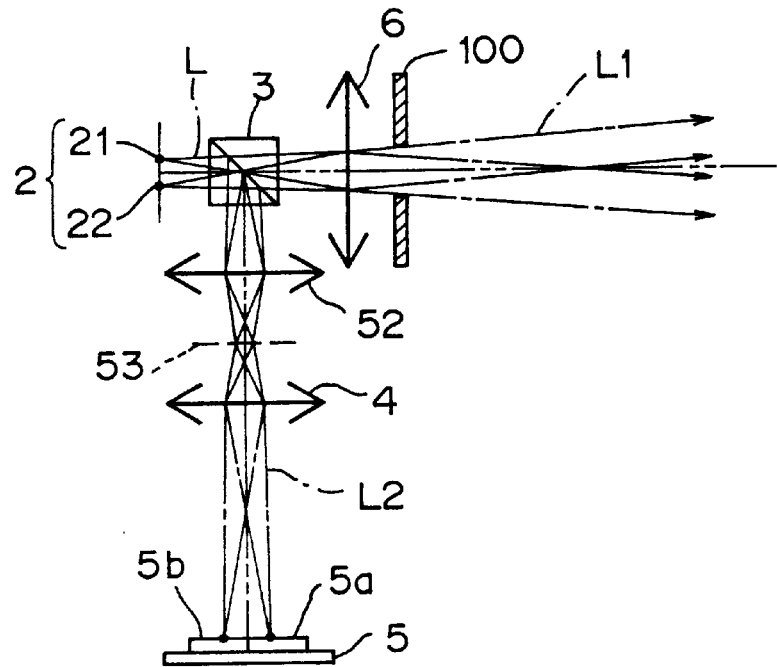
FIG. 16 is a layout diagram showing another embodiment.
Figure 17:
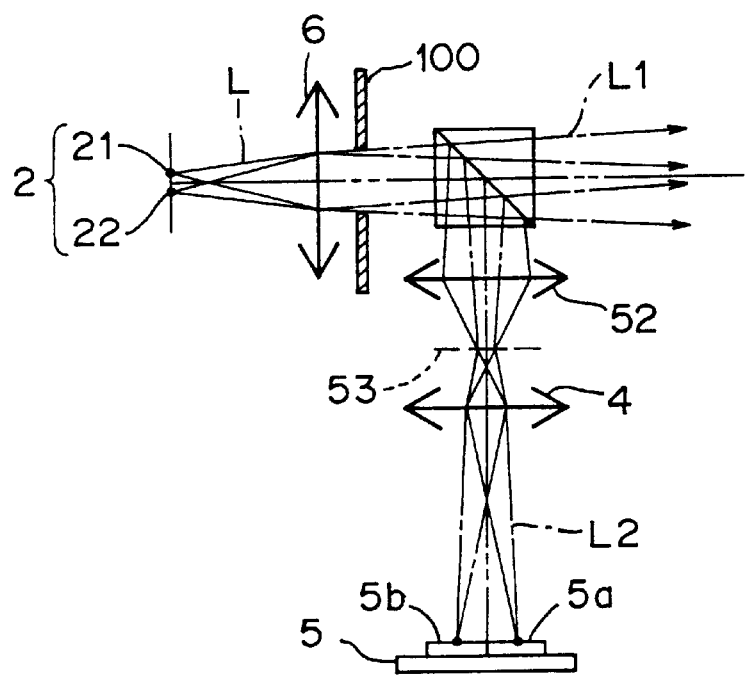
FIG. 17 is a layout diagram showing a still other embodiment.

In the present invention, as shown in FIGS. 16 and 17, for example, an aperture regulating plate 100 may be disposed behind the collimator lens 6 for regulating the shapes of spots of laser beams emitted from the laser diode array 2.

For the optical path split element for splitting laser beams into image light and monitor light, a half mirror or the like may be used as well as the beam splitter.

Figure 18:
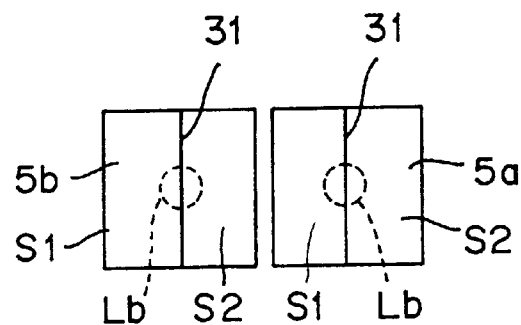
FIG. 18 is a plan view showing another photoreceptor element.

For purposes of monitoring position adjustment in Embodiment 7, as in Examples 1 and 3 of monitor position correction, all the light receiving faces 5a, 5b of the photoreceptor element 5 may be designed to be two-part light receiving surfaces as shown in FIG. 18 so that respective light receiving faces 5a, 5b are used for position detection or so that position detection is carried out only by any one light receiving face.

Figure 19:
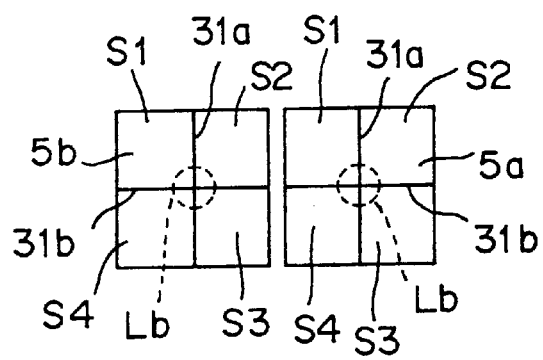
FIG. 19 is a plan view showing a still other photoreceptor element.

Further, as FIG. 19 shows, the light receiving faces 5a, 5b may be designed to be four-part light receiving faces split by two split lines 31a, 31b extending in rectangular relation to each other, each thus defining light receiving areas S1, S2, S3, S4, so that position adjustment can be performed in directions perpendicular to split lines 31a and 31b, that is, in two directions perpendicular to each other.

Figure 20:
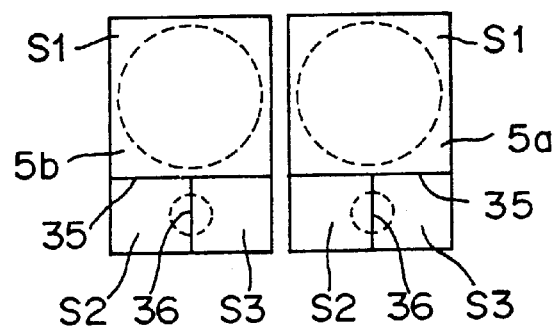
FIG. 20 is a plan view showing a still further photoreceptor element.

Further, in Example 2 of monitor position adjustment, as FIG. 20 shows, the light receiving faces 5a, 5b of the photoreceptor element 5 are three-part light receiving surfaces so that position detection can be performed at respective light receiving faces 5a, 5b, or so that position detection is carried out at one selected light receiving face only. For purposes of above described shifting, besides parallel shifting of the photoreceptor element 5 and pivotal movement of the transparent flat plate, it is also possible to use a method of shifting the magnifier lens 4 in a direction perpendicular to the split line of the light receiving surface.

The laser diode array unit of the present invention is not limited to the above described embodiments, and may be modified, changed, altered, or varied in various ways within the scope and spirit of the appended claims.

What is claimed is:

1. A laser diode array unit comprising:
    a laser diode array having a plurality of light emitting sources which are drivingly controlled independently of each other;
    a beam split element for splitting monitor beams from respective laser beams emitted from the light emitting sources of the laser diode array;
    a photoreceptor element for independently monitoring respective intensity of light of a plurality of monitor beams; and
    a correction mechanism selected from the group consisting of a photoreceptor element movement mechanism and a transparent flat plate disposed before the photoreceptor element,
    wherein the correction mechanism effects a relocation of a point of incidence of a monitor beam relative to the photoreceptor element.

2. A laser diode array unit in accordance with claim 1, wherein the light emitting sources are two in number, and the two light emitting sources are synchronously driven.

3. A laser diode array unit in accordance with claim 1, wherein the photoreceptor element has a split light receiving surface for split reception of a point of incidence of a laser beam emitted from at least one light emitting source, and the correction mechanism is a photoreceptor element movement mechanism, the photoreceptor element movement mechanism having a mechanism to shift the photoreceptor relative to a point of incidence of a laser beam emitted from at least one light emitting source.

4. A laser diode array unit in accordance with claim 1, wherein the photoreceptor element has a split light receiving surface; and electric currents are output from the photoreceptor element according to the intensity of light falling on respective light receiving areas of the split light receiving surface.

5. A laser diode array unit in accordance with claim 1, further comprising a magnifier optic system for enabling a monitor beam to be condensed on the photoreceptor element to form a magnified image.

6. A laser diode array unit in accordance with claim 5, wherein the magnifier optic system has a lateral magnification of 70× or more.

7. A laser diode array unit in accordance with claim 5, wherein a relay lens is provided between the laser array and the magnifier optic system so that an intermediate illuminant image of the monitor beam can be formed between the relay lens and the magnifier optic system.

8. A laser diode array unit in accordance with claim 5, wherein the magnifier optic system includes a first set of lenses having a negative power and a second set of lenses having a positive power, the first set of lenses and the second set of lenses being arranged in a sequential order from a side closer to the photoreceptor element.

9. A laser diode array unit in accordance with claim 1, wherein the correction mechanism is a transparent flat plate, and the transparent flat plate is moveable to effect movement of a point of incidence of a monitor beam relative to the photoreceptor element.

10. A laser diode array unit comprising:

a laser diode array having a plurality of light emitting sources which are drivingly controlled independently of each other;

a convergent lens for converting laser beams emitted from the light emitting sources of the laser diode array into substantially parallel or convergent bundles of rays;

a beam split element for splitting monitor beams from respective laser beams emitted from the light emitting sources of the laser diode array;

a photoreceptor element for independently monitoring respective intensity of light of a plurality of monitor beams;

a magnifier optic system for enabling a monitor beam to be condensed on the photoreceptor element to form a magnified image; and a correction mechanism selected from the group consisting of a photoreceptor element movement mechanism and a transparent flat plate disposed before the photoreceptor element, wherein the correction mechanism effects a relocation of a point of incidence of a monitor beam relative to the photoreceptor element.

11. A laser diode array unit in accordance with claim 10, wherein the convergent lens is disposed between the laser diode array and the beam split element.

12. A laser diode array unit in accordance with claim 10, wherein the convergent lens is so disposed as to receive laser beams emergent from the beam split element.

13. A laser diode array unit comprising:

a laser diode array having a plurality of light emitting sources which are drivingly controlled independently of each other;

a beam split element for splitting monitor beams from respective laser beams emitted from the light emitting sources of the laser diode array;

a photoreceptor element for independently monitoring respective intensity of light of the plurality of monitor beams;

a magnifier optic system for enabling the monitor beam to be condensed on the photoreceptor element to form a magnified image;

control means for computing an intensity of a monitor beam magnified on the photoreceptor element and for driving a laser diode drive circuit according to the result of a computed intensity; and a correction mechanism selected from the group consisting of a photoreceptor element movement mechanism and a transparent flat plate disposed before the photoreceptor element, wherein the correction mechanism effects a relocation of a point of incidence of a monitor beam relative to the photoreceptor element.

14. A method for monitoring laser beam intensity with respect to laser beams emitted from a plurality of light emitting sources of a laser diode array, the light emitting sources being drivingly controlled independently of each other, the method comprising the steps of:

emitting at least two beams of light from the plurality of light emitting sources;

splitting emitted beams of light to form monitor beams corresponding to each emitted beam;

condensing each monitor beam prior to its incidence on a reception surface of a photoreceptor element to form a magnified image, wherein the photoreceptor element outputs a signal representative of an intensity of a received monitor beam; and modifying a position of the photoreceptor element to properly receive an incident monitor beam with respect to the reception surface of the photoreceptor element.

15. A laser diode array unit comprising:

a laser diode array having a plurality of light emitting sources which are drivingly controlled independently of each other;

a first beam split element for splitting monitor beams from respective laser beams emitted from the light emitting sources of the laser diode array;

a photoreceptor element for independently monitoring respective intensity of light of a plurality of monitor beams, wherein the photoreceptor element has a split light receiving surface for split reception of a point of incidence of a laser beam emitted from at least one light emitting source; and a second beam split element, positioned before the photoreceptor element, to effect multiple points of incidence of a laser beam emitted from at least one light emitting source relative to the split light receiving surface of the photoreceptor.

16. A laser diode array unit in accordance with claim 15, further comprising a magnifier optic system for enabling the monitor beam to be condensed on the photoreceptor element to form a magnified image.

17. A laser diode array unit comprising:

a laser diode array having a plurality of light emitting sources which are drivingly controlled independently of each other;

a convergent lens for converting laser beams emitted from the light emitting sources of the laser diode array into substantially parallel or convergent bundles of rays;

a beam split element for splitting monitor beams from respective laser beams emitted from the light emitting sources of the laser diode array;

a photoreceptor element for independently monitoring respective intensity of light of a plurality of monitor beams, wherein the photoreceptor element has a split light receiving surface for split reception of a point of incidence of a laser beam emitted from at least one light emitting source;

a magnifier optic system for enabling the monitor beam to be condensed on the photoreceptor element to form a magnified image; and a second beam split element, positioned before the photoreceptor element, to effect multiple points of incidence of a laser beam emitted from at least one light emitting source relative to the split light receiving surface of the photoreceptor.

18. A laser diode array unit comprising:

a laser diode array having a plurality of light emitting sources which are drivingly controlled independently of each other;

a beam split element for splitting monitor beams from respective laser beams emitted from the light emitting sources of the laser diode array;

a photoreceptor element for independently monitoring respective intensity of light of a plurality of monitor beams, wherein the photoreceptor element has a split light receiving surface for split reception of a point of incidence of a laser beam emitted from at least one light emitting source;

a magnifier optic system for enabling a monitor beam to be condensed on the photoreceptor element to form a magnified image;

control means for computing an intensity of a monitor beam magnified on the photoreceptor element and for driving a laser diode drive circuit according to the result of a computed intensity; and a second beam split element, positioned before the photoreceptor element, to effect multiple points of incidence of a laser beam emitted from at least one light emitting source relative to the split light receiving surface of the photoreceptor.

19. A laser diode array unit comprising:

a laser diode array having a plurality of light emitting sources which are drivingly controlled independently of each other;

a beam split element for splitting monitor beams from respective laser beams emitted from the light emitting sources of the laser diode array;

a photoreceptor element for independently monitoring respective intensity of light of a plurality of monitor beams;

a magnifier optic system for enabling the monitor beam to be condensed on the photoreceptor element to form a magnified image; and a relay lens, provided between the laser array and the magnifier optic system, so that an intermediate illuminant image of the monitor beam can be formed between the relay lens and the magnifier optic system.

20. A laser diode array unit comprising:

a laser diode array having a plurality of light emitting sources which are drivingly controlled independently of each other;

a beam split element for splitting monitor beams from respective laser beams emitted from the light emitting sources of the laser diode array;

a photoreceptor element for independently monitoring respective intensity of light of a plurality of monitor beams; and a magnifier optic system for enabling the monitor beam to be condensed on the photoreceptor element to form a magnified image, the magnifier optic system including a first set of lenses having a negative power and a second set of lenses having a positive power, the first set of lenses and the second set of lenses being arranged in a sequential order from a side closer to the photoreceptor element.

* * * * *

UNITED STATES PATENT AND TRADEMARK OFFICE
CERTIFICATE OF CORRECTION

PATENT NO : 6,021,145

DATED : February 1, 2000

INVENTOR(S): Toshio NAIKI and Akiyoshi HAMADA

It is certified that error appears in the above-identified patent and that said Letters Patent is hereby corrected as shown below:

Column 10, line 47 (claim 1, line 9), delete "intensity", and insert --intensities--.

Column 11, line 16 (claim 7, line 2), delete "wherein", and insert --further comprising--.

Column 11, line 16 (claim 7, line 2), after "lens", insert --, which--.

Column 11, line 18 (claim 7, line 4), delete the first instance of "the", and insert --a--.

Column 11, line 43 (claim 10, line 12), delete "intensity", and insert --intensities--.

Column 12, line 2 (claim 13, line 9), delete "intensity", and insert --intensities--.

UNITED STATES PATENT AND TRADEMARK OFFICE
CERTIFICATE OF CORRECTION

PATENT NO : 6,021,145

DATED : February 1, 2000

INVENTOR(S): Toshio NAIKI and Akiyoshi HAMADA

It is certified that error appears in the above-identified patent and that said Letters Patent is hereby corrected as shown below:

Column 12, line 4 (claim 13, line 11), delete "the", and insert --a--.

Column 12, line 43 (claim 15, line 9), delete "intensity", and insert --intensities--.

Column 13, line 2 (claim 17, line 12), delete "intensity", and insert --intensities--.

Column 13, line 7 (claim 17, line 17), delete "the", and insert --a--.

Column 13, line 24 (claim 18, line 9), delete "intensity", and insert --intensities--.

Column 14, line 10 (claim 19, line 9), delete "intensity", and insert --intensities--.

UNITED STATES PATENT AND TRADEMARK OFFICE
CERTIFICATE OF CORRECTION

PATENT NO : 6,021,145

DATED : February 1, 2000

INVENTOR(S): Toshio NAIKI and Akiyoshi HAMADA

It is certified that error appears in the above-identified patent and that said Letters Patent is hereby corrected as shown below:

Column 14, line 12 (claim 19, line 11), delete "the monitor beam", and insert --monitor beams--.

Column 14, line 29 (claim 20, line 9), delete "intensity", and insert --intensities--.

Column 14, line 31 (claim 20, line 11), delete "the monitor beam", and insert --monitor beams--.

Signed and Sealed this

Eighth Day of May, 2001

*Attest:*

NICHOLAS P. GODICI

*Attesting Officer*    *Acting Director of the United States Patent and Trademark Office*